United States Patent [19]

Tratz et al.

[11] 4,084,022

[45] Apr. 11, 1978

[54] METHOD FOR TIN PLATING PRINTED BOARDS

[75] Inventors: Josef Tratz; Egon Jäger, both of Munich, Germany

[73] Assignee: Siemens Aktiengesellschaft, Munich, Germany

[21] Appl. No.: 725,944

[22] Filed: Sep. 23, 1976

[30] Foreign Application Priority Data

Sep. 30, 1975 Germany .............................. 2543674

[51] Int. Cl.² .......................... H05K 3/22; H05K 3/24
[52] U.S. Cl. ..................................... 427/96; 427/123; 427/259
[58] Field of Search .......................... 427/96, 123, 259

[56] References Cited

U.S. PATENT DOCUMENTS 3,090,706   5/1963   Cado ...................................... 427/96

FOREIGN PATENT DOCUMENTS 893,479   4/1962   United Kingdom .................... 427/96
915,181   1/1963   United Kingdom .................... 427/96

*Primary Examiner*—Ralph S. Kendall
*Attorney, Agent, or Firm*—Schuyler, Birch, Swindler, McKie & Beckett

[57] ABSTRACT

A method for tin plating printed boards is disclosed wherein faulty bonding is prevented by masking the printed boards with a heat and solder resistant coating material. This coating material is selectively applied to the printed boards in those areas where misbonding due to gap bridging and bubble formation is most likely to occur. For example, a small amount of coating material may be applied across conductor paths between two adjacent areas. In addition, the coating material may be evenly distributed in a grid like fashion throughout the area of the printed boards. Where the tin plating process is a wave soldering process, the coating material may be applied in the direction of conveyance of the printed board in order to avoid interference with the discharge of the tin.

7 Claims, 1 Drawing Figure

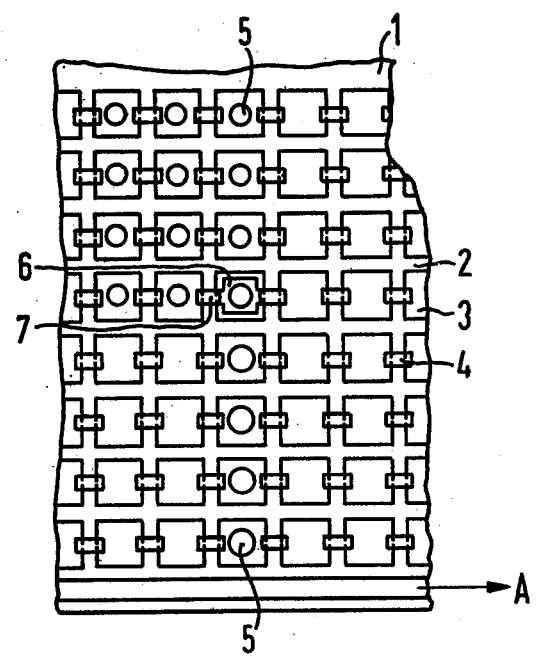

METHOD FOR TIN PLATING PRINTED BOARDS

BACKGROUND OF THE INVENTION

The invention relates to a method for coating and bonding printed boards with tin by passing the printed boards through a bath of tin. The printed boards have areas immediately adjacent to one another and/or completely surrounded by conductor paths for which tinning is desired.

During this tinning process, due to the surface tension of the liquid tin, several undesirable effects might occur such as the bridging of neighboring conductor paths or the covering by solder bubbles of areas of fairly small dimensions which are surrounded by conductor paths. For example, such areas appear in printed boards employed for applying potential and provided with a network of intersecting conductor paths. In the case of wiring boards for rack back panels having a multiplicity of conductor paths, the number of such unwanted tin bubbles can be so large that a finishing operation is no longer economically justified. Such wiring boards are penetrated by pins, some of which might be bonded with the conductor paths and others of which might not be bonded. In the bonded pins, the hole is surrounded by a soldering terminal bonded to the conductor paths by connecting segments. The holes which are not bonded are located in the free areas between the conductor paths. However, if bubbles form in any of these areas, misbondings might occur between such areas and the conductor paths. During the tinning process, tin bubbles also might be formed that burst open prior to solidification and cause tin spillings that may likewise lead to misbondings.

It is an object of the invention to avoid both bridging and bubble formation between neighboring conductor paths.

SUMMARY OF THE INVENTION

The objects of the invention are achieved in accordance with the invention by masking one part of an unused area between the conductor paths and a narrow strip of the conductor path with a heat and solder resistant coating material. This coating material is deposited on those regions of the printed board where bridging and bubble formation are likely to occur. The coating material causes an inhomogeneity in the distribution of the surface tension of the soldering tin which results in a kind of notch effect. Due to this notch effect, the coating material causes a developing tin bubble or tin bridge to burst. Thus, formation of misbondings is prevented with a high degree of reliability. Before the tinning process the conductor paths are already electrolytically plated with a thin film of tin. During the tinning process this tin becomes molten and the narrow strip of conductor path covered by the coating material is underflown by the soldering tin so that on this location, too, the conductor cross-section is more or less total.

According to a further development of the invention, lacquer is deposited as the coating material. Normally, lacquer is used to prevent the tinning of printed boards or parts thereof. It is heat and solder resistant and combines well with the base material of the printed board, e.g. epoxy resin.

According to another further development of the invention, the coating material is deposited in very narrow widths. In this way, an excessive section of a conductor tract is not covered regardless of the position of the coating material. If the coating material runs crosswise between the borderlines of the conductor paths and the unused areas, the notch effect is maximized and bubble formation is prevented with a high degree of reliability. Moreover, changes in the position of the coating material on the printed board are not critical. The length of the coating material on the printed board might be kept so short that in each case only one short section of a conductor path and the adjacent unused area are covered. Thus, a minimum amount of coating material is required. Also, by using a minimum amount of coating material, there is less chance that the coating material might find its way to places where it could have a disturbing effect. For example, one such place would be the edge of a hole designed for a bonded pin.

According to a further development of the invention, the coating material covers the conductor path and a short section of the two adjacent unused areas. Thus, not only is bubble formation or gap bridging prevented at both sides of the conductor path with one coating, but it is also possible to apply the coating material over two or more unused areas and conductor paths. Such a coating is easier to apply than individual coatings because it need not be placed with as much precision. According to a further development of the invention, in a network of potential-carrying intersecting conductor paths, the coating material is placed in a grid in accordance with the distance of the conductor tracks. The coating material may be evenly distributed throughout the printed board and conveniently applied midway between two adjacent conductor paths. Since the coating material does not disturb the tinning process, it may also be applied in areas where it is actually not needed without causing harm. Thus, it is possible to apply a constant coating pattern even for individually different printed boards. This results in considerable rationalization of the treatment of the printed board.

According to another further development of the invention, when the tinning process occurs in a wave soldering bath, the coating material is applied to run in the direction of conveyance of the printed board. It is customary to pass an angularly rising printed board across the solder flow as for example described in UK Patent No. 798454. This results in a better discharge of the tin. If the coatings are applied on the conductor paths running crosswise to the direction of conveyance, the conductor paths running in the direction of conveyance are kept free from coating material and the tin flows away more easily.

BRIEF DESCRIPTION OF THE DRAWINGS

The principles of the invention will be more readily understood by reference to the drawing which shows a printed circuit board of the present invention.

DETAILED DESCRIPTION OF THE INVENTION

The FIGURE shows a top view of a part of a printed board 1 provided with a network of intersecting conductor paths 2 between which are placed unused areas 3 that must not be tinned. To ensure this, the conductor paths 2 and the unused areas 3 are partly covered with a coating material 4 such as lacquer.

The coating material 4 is applied crosswise to the conductor paths 2 in such a manner that it covers the latter as well as a short section of the two adjacent unused areas 3. The lacquer 10 adheres well to the unused areas 3 and, hence, cannot be separated therefrom during the tinning process of the printed board 1. This coating material 4 produces an inhomogeneity in the surface tension of the soldering tin and, from the very outset, prevents the formation of bubbles which would otherwise cover the areas surrounded by the conductor paths. The printed board 1 has holes 5 for traversing pins (not shown). Some of these holes 5 are surrounded by soldering terminals 6 connected over narrow segments 7 with the network of conductor paths 2. Experiments have shown that the coating material 4 does not interfere with the tinning of these segments 7 even if the coating material 4 covers the latter. Other holes 5 are not surrounded by soldering terminals 6. These holes 5 must be kept absolutely free from tin bubbles in order to prevent misbonding in these areas. Tinning is accomplished by passing the printed board 1 across a flow soldering bath in the direction of arrow A. The tinning occurs in a track of the angularly rising printed board where the tin has a better discharge. To prevent the coating material 4 from interfering with the discharge of the tin, it is applied to the conductor paths which run crosswise to the direction of conveyance of the printed board 1, that is, in the direction of arrow A.

We claim:

1. A process for bonding a printed circuit board with tin by passing the printed circuit board through a bath of tin, said printed circuit board having a number of closely spaced conductor paths separated by non-conductive areas, wherein the process comprises the step of: masking selected portions of said printed circuit board with heat and solder resistant coating material where the non-conductive areas are small to prevent misbonding due to bubble formation and gap bridging, each of said selected portions including a short section of an associated conductor path and a small section of the non-conductive areas adjacent to the short section of said associated conductor path.

2. The process as defined in claim 1, wherein said coating material is lacquer.

3. The process as defined in claim 1, wherein each of said selected portions includes a narrow strip crossing said associated conductor path.

4. The process as defined in claim 3, wherein said selected portions include a plurality of said narrow strips crossing a plurality of parallel running conductor paths.

5. The process as defined in claim 3, wherein said printed circuit board comprises a network of intersecting conductor paths, said selected portions being evenly distributed over said printed circuit board.

6. The process as defined in claim 5, wherein said process is a wave soldering process and said selected portions include a plurality of said narrow strips crossing a plurality of said conductor paths, said narrow strips extending across said conductor paths parallel to the direction of conveyance of said printed circuit board.

7. A process for bonding a printed circuit board with tin by passing the printed circuit board through a bath of tin, said printed circuit board having a number of closely spaced conductor paths separated by non-conductive areas, wherein the process comprises the steps of: masking selected portions of said printed circuit board with heat and solder resistant coating material where the non-conductive areas are small to prevent misbonding due to bubble formation and gap bridging, each of said selected portions including a short section of an associated conductor path and a small section of the non-conductive areas adjacent to the short section of said associated conductor path; and, passing said printed circuit board through said bath of tin to bond the full length of said conductor paths with tin.

* * * * *